United States Patent [19]

Steel

[11] 4,113,983
[45] Sep. 12, 1978

[54] INPUT FILTERING APPARATUS FOR LOUDSPEAKERS

[75] Inventor: Paul Franklin Steel, Luton, England

[73] Assignee: Teledyne Acoustic Research, Norwood, Mass.

[21] Appl. No.: 678,461

[22] Filed: Apr. 20, 1976

[30] Foreign Application Priority Data

Apr. 24, 1975 [GB] United Kingdom ............... 16999/75

[51] Int. Cl.² ............................................. H04B 1/64
[52] U.S. Cl. .................. 179/1 VL; 330/301; 179/1 D; 179/1 P
[58] Field of Search ........... 179/1 D, 1 F, 1 A, 1 VL; 333/18, 14; 330/109, 149

[56] References Cited

U.S. PATENT DOCUMENTS

| | | | |
|---|---|---|---|
| 2,606,970 | 8/1952 | Scott | 333/18 |
| 3,497,621 | 2/1970 | Erath | 179/1 D |
| 3,805,091 | 4/1974 | Colin | 330/109 |
| 3,934,190 | 1/1976 | Dolby | 333/14 |

Primary Examiner—Kathleen H. Claffy
Assistant Examiner—E. S. Kemeny
Attorney, Agent, or Firm—Larson, Taylor and Hinds

[57] ABSTRACT

Improved input filtering apparatus for loudspeaker systems, and loudspeaker systems including such apparatus. The bass roll-off point of input filtering apparatus for loudspeakers is automatically adjusted to an optimum in accordance with the amplitude and spectral content of the audio signal being received at the time, thereby attenuating components in the signal liable to cause "bottoming" of the loudspeaker. The input filter apparatus comprises a first high-pass filter having a breakpoint frequency at or near the lower threshold of the audio frequency range, a second variable bandwidth, high-pass filter connected to receive the first high-pass filter output, a feedback circuit responsive to the second filter output to provide a feedback signal as a linear function thereof with a gain which is substantially inversely proportional to the square of the frequency, and circuit means including threshold means connected with the second filter and responsive to the said feedback signal to relatively rapidly increase the breakpoint frequency of the second filter in response to values of the feedback signal which exceed a threshold and to relatively showly reduce that breakpoint frequency in response to values of the feedback signal which do not exceed the said threshold. Bass equalization circuit means having a frequency response at the low end of the audio spectrum which is substantiallythe inverse of the frequency response of said loudspeaker means are provided between the output of the second filter and the loudspeaker drive circuit.

8 Claims, 10 Drawing Figures

1

INPUT FILTERING APPARATUS FOR LOUDSPEAKERS

FIELD OF THE INVENTION

This invention relates to loudspeaker systems, and more particularly to input filtering apparatus for loudspeaker systems.

The response of a loudspeaker is substantially linear only when the amplitude of movement, that is to say the distance of travel, of the loudspeaker diaphragm or cone is within a certain range characteristic of that loudspeaker, referred to herein as the linear operating range of the loudspeaker. If the loudspeaker is operated so that the amplitude of movement of the cone or diaphragm exceeds the linear operating range, distortion of the output results (known as bottoming) which is severly objectionable to a listener.

It is known that the amplitude of movement of a loudspeaker diaphragm or cone for a given output is inversely related to the frequency of the output. Accordingly, "bottoming" is most likely to be caused by low frequency components of the signal.

In practice, the incidence of bottoming in the loudspeaker is to some extent reduced by the natural bass roll-off of the loudspeaker; this has the effect of attenuating the amplitude of movement of the cone at low frequencies. A further reduction can be achieved by providing a high-pass filter in the input channel to the loudspeaker to attenuate low frequency components of the input signal to the loudspeaker. However, to provide high fidelity reproduction of, for example, music, it is desirable to avoid introducing permanent attenuation of the low audio frequency components. Indeed, it is often desirable to eliminate the effect of the bass roll-off of the loudspeaker in attenuating these components, for example by providing an equalizing circuit in the input channel to the loudspeaker. Provision of such an equalizing circuit, or other means to extend the bass response of a loudspeaker system, aggravates the problem of bottoming.

SUMMARY OF THE INVENTION

It is an object of the present invention to provide input filtering apparatus for a loudspeaker, the filtering characteristics of the apparatus being controlled so as to limit the amplitude of movement of the loudspeaker cone or diaphragm to within the linear operating range of the loudspeaker.

The invention provides input filtering apparatus for a loudspeaker, the apparatus including a variable bandwidth high-pass filter and control means therefor to vary the breakpoint frequency thereof in accordance with the amplitude and spectral content of the audio signal being received at the time; the breakpoint frequency is varied so as to attenuate components of the signal which would otherwise cause the loudspeaker to be driven outside its linear operating range. By varying the breakpoint frequency of the filter, as distinct from, for example, the Q of the filter, there is minimal effect on components of the signal other than those likely to cause the non-linear operation.

DESCRIPTION OF THE PREFERRED EMBODIMENT

Further features and advantages of the invention will appear from the following description of embodiments thereof, described by way of example only with reference to the accompanying drawings wherein.

Figure 1:
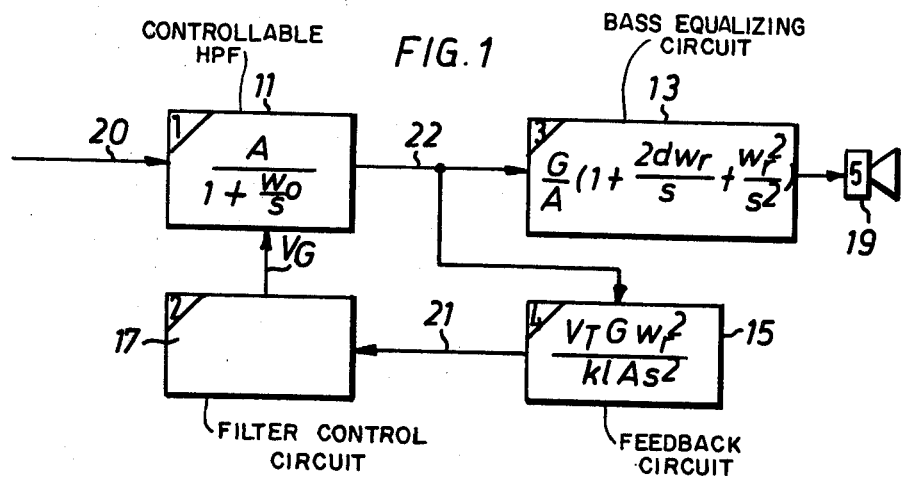
FIG. 1 is a block diagram of a loudspeaker system embodying input filtering apparatus in accordance with the invention.

A list of the symbols used in the drawings and in the following description appears at the end of the description.

FIG. 1 is a block diagram of a loudspeaker system comprising simplified input filtering apparatus embodying the invention. The system comprises a controllable filter 11, a bass equalizing circuit 13, feedback circuit 15, filter control circuit 17 and loudspeaker 19, the audio input signal to the system being provided on line 20.

The travel of a loudspeaker cone is inversely proportional to the square of the frequency for a constant sound pressure output. The bass equalizing circuit 13 is arranged so that the output sound pressure from the loudspeaker 19 is proportional to the input to the equalizing circuit on line 22, the response of the circuit being of the form $$\frac{G}{A}(1 + \frac{2d\,\omega r}{s} + \frac{\omega r^2}{s^2})$$

The feedback circuit 15 comprises a linear network with a frequency response which is inversely proportional to the square of the frequency, and thus responds to the signal on line 22 to provide a feedback signal on line 21 which is an analog of estimated cone travel. The gain factor of circuit 15 is selected so that its output equals $V_T$ when the loudspeaker cone is estimated to reach its travel limit L. Filter control circuit 17 controls the breakpoint frequency $w_o$ of the filter 11 such that if the feedback signal on line 21 is greater than $V_T$, $w_o$ rapidly increases, so reducing the amplitude of low frequency components of the signal supplied to the loudspeaker. If the feedback signal on line 21 is less than $V_T$, $w_o$ is gradually returned to a low value, thereby permitting progressively lower frequency components of signals to pass through the loudspeaker.

Figure 2:
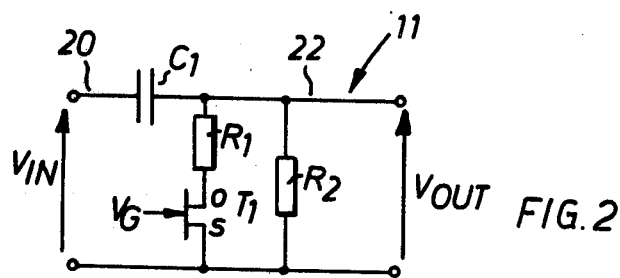
FIGS. 2, 3, 4 and 5 are simplified diagrams of circuits suitable for implementing the blocks of FIG. 1.

FIG. 2 shows a simple configuration for a controlled filter circuit 11 in which the breakpoint frequency $w_o$ is varied by varying the gate voltage $V_G$ applied to the field effect transistor $T_1$. The drain-source resistance $R_T$ of transistor $T_1$ is dependant on $V_G$, such that $R_T$ is small for low gate voltages and large for large negative gate voltages. The combination of resistors $R_1$, $R_2$ and $R_T$ form the resistive part of a C-R network. If $R_N$ is the composite resistive part, $$\frac{V\text{out}}{V\text{in}} = \frac{1}{1 + \frac{1}{sC_1R_N}}$$

and $R_N$ is variable between the limits:

$$(R_1R_2)/(R_1 + R_2) \text{ and } R_2$$

This provides the quantities A and $w_o$ with the values 1 and $1/(C_1R_N)$ respectively.

Figure 3:
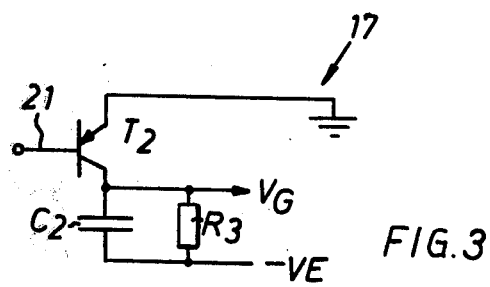

The circuit in FIG. 3 is suitable for controlling the filter of FIG. 2. The transistor $T_2$ acts as a switch. If the feedback signal voltage goes sufficiently negative with respect to earth, the transistor switches on and the voltage across the capacitor $C_2$ rises fast towards earth potential. When the travel feedback signal the transistor switched off, the charge on the capacitor is drained through the resistor $R_3$ causing the voltage to decay towards the negative rail. $V_T$ in this case is approximately 0.7V if $T_2$ is a silicon transistor.

Figure 4:
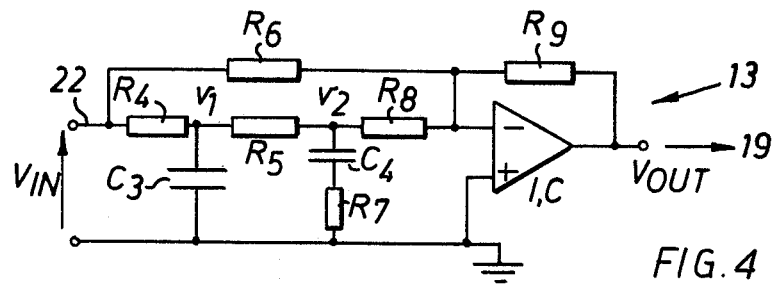

The required form of response for the bass equalizing circuit 13 is $(a + (b/s) + (c/s^2))$ and the circuit of FIG. 4 provides such a response as can be shown as follows: Assume I.C. performs as an ideal operational amplifier so that $$-V\text{out} = \frac{R_9}{R_6} V\text{in} + \frac{R_9}{R_8} v_2$$

if $R_8$ is much larger than $R_5$, $$v_2 = \frac{1 + sC_4R_7}{1 + sC_4(R_5 + R_7)} v_1$$

and if $R_5$ is much larger than $R_4$, $$v_1 = \frac{V\text{in}}{1 + sC_3R_4}$$

Hence, $-\frac{V\text{out}}{V\text{in}} = \frac{R_9}{R_6} + \frac{R_9}{R_8} \times \frac{(1 + s C_4 R_7)}{[1 + s C_4 (R_5 + R_7)](1 + s C_3 R_4)}$ If $C_4 (R_5 + R_7)$ and $C_3 R_4$ are sufficiently large time constants, then $$-\frac{V\text{out}}{V\text{in}} = \frac{R_9}{R_6} + \frac{1}{s} \times \frac{R_9 R_7}{(R_5 + R_7) C_3 R_4 R_8} + \frac{1}{s^2} \frac{R_9}{R_8 R_4(R_5 + R_7)C_3C_4}$$

A suitable choice of values for the components will produce the desired response.

Figure 5:
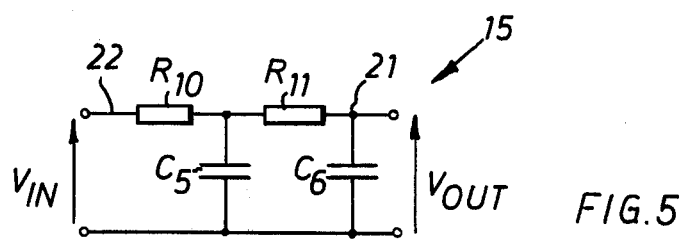

To produce a response inversely proportional to the square of the frequency for the feedback circuit 15, two R-C networks can be cascaded as shown in FIG. 5. In this case:

$$-\frac{V\text{out}}{V\text{in}} = \frac{1}{(1 + sC_5R_{10})(1 + sC_6R_{11})}$$

if $C_5R_{10}$ and $C_6 R_{11}$ are large time constants $$\frac{V\text{out}}{V\text{in}} \simeq \frac{1}{s^2 C_5 C_6 R_{10} R_{11}}$$

This is the desired response for the feedback circuit 15 of FIG. 1.

A practical embodiment of the invention will now be described, the embodiment having been specifically tailored to suit speaker type AR7.

Figure 6:
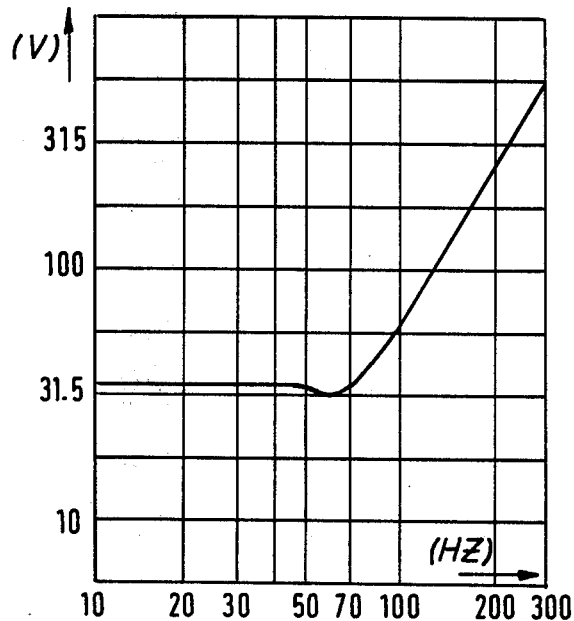
FIG. 6 is a graph illustrating the variation of peak input voltage with frequency of a particular loudspeaker operated at the limit of its linear operating range.
Figure 7:
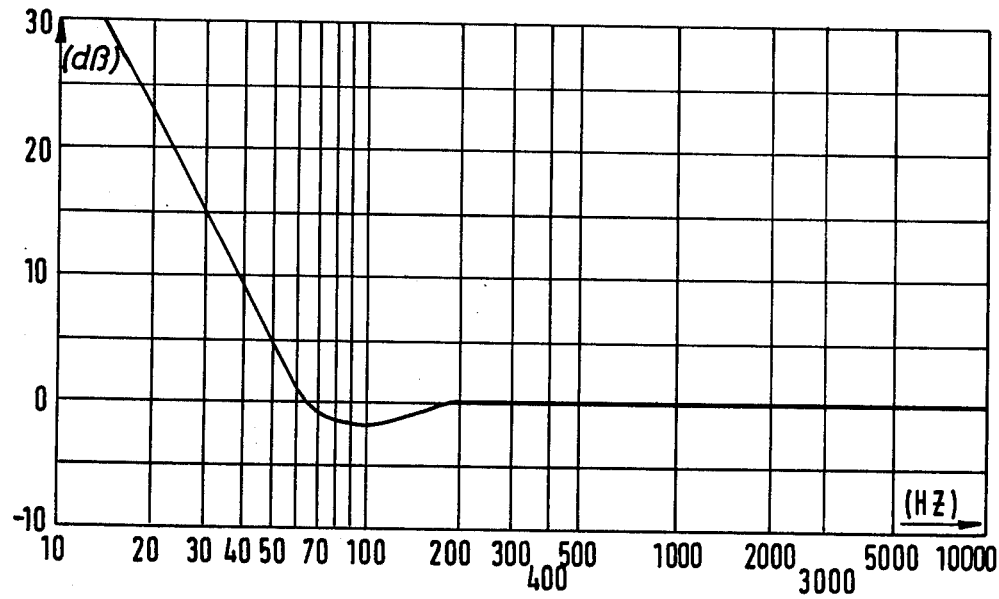
FIG. 7 is a graph illustrating the required frequency response of an equalising circuit for the loudspeaker to which FIG. 6 relates.

The graphs of FIGS. 6 and 7 were derived experimentally. FIG. 6 illustrates the variation of peak input voltage with frequency of a speaker type AR 7 when operated at the limit of its linear operating range. FIG. 7 illustrates the inverse of the frequency response of the loudspeaker at the low frequency end of the audio spectrum, and thus forms the response characteristic required for the equalizing circuit 13. From these experiments, the following values for the loudspeaker parameters were derived:

$w_r = 470$ rad s$^{-1}$
$d = 0.46$
$L = 0.007$m
$k = 4700$ V/m

Figure 8:
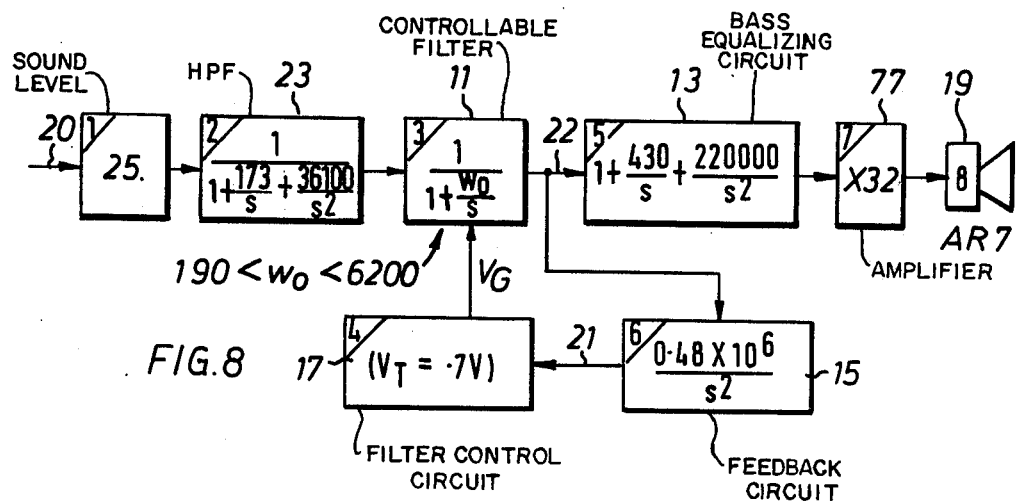
FIG. 8 is a block diagram of a practical embodiment of the invention.

FIG. 8 is a block diagram of the practical embodiment, those parts of the system which are common to that of FIG. 1 being indicated by corresponding reference numerals.

Figure 10:
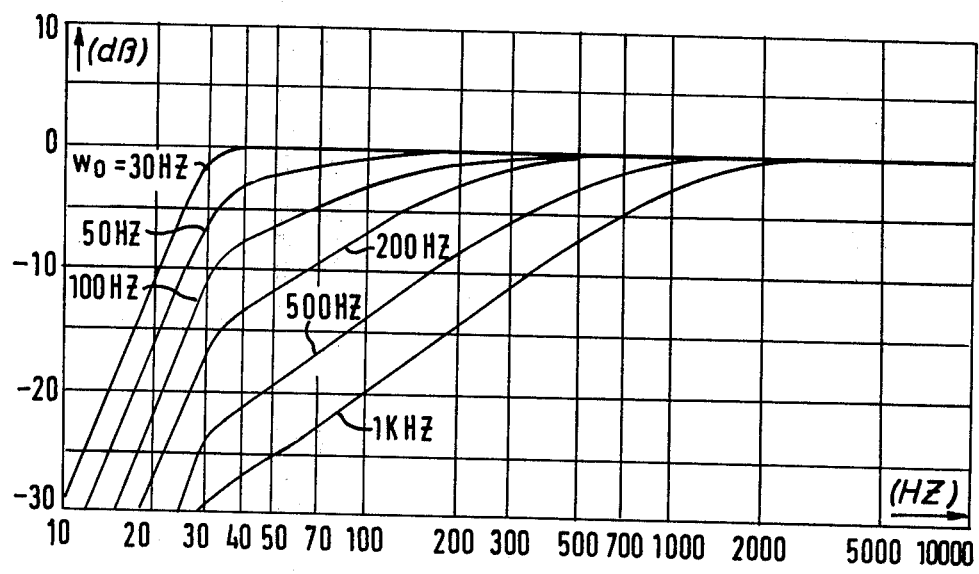
FIG. 10 is a graph illustrating different frequency response characteristics of the input stages of the embodiment of FIG. 8.

Since low frequencies produce large movement of the cone, rumble in a sound source can be responsible for large movement, so a high-pass filter 23 is incorporated for a sharp roll off below 30 Hz when combined with the controlled filter 11. The range of variation of the controlled filter breakpoint frequency is from 190 to 6200 radians per second. The graph of FIG. 10 shows the combined response of circuits 23 and 11 for various breakpoint frequencies of the controllable filter covering the full range of variation available. To make the system compatible with the sound source employed, an attenuator is incorporated with a volume control for the sound level block 25. A power amplifier 27 having a gain of 32 precedes the AR 7 speaker 19.

Figure 9:
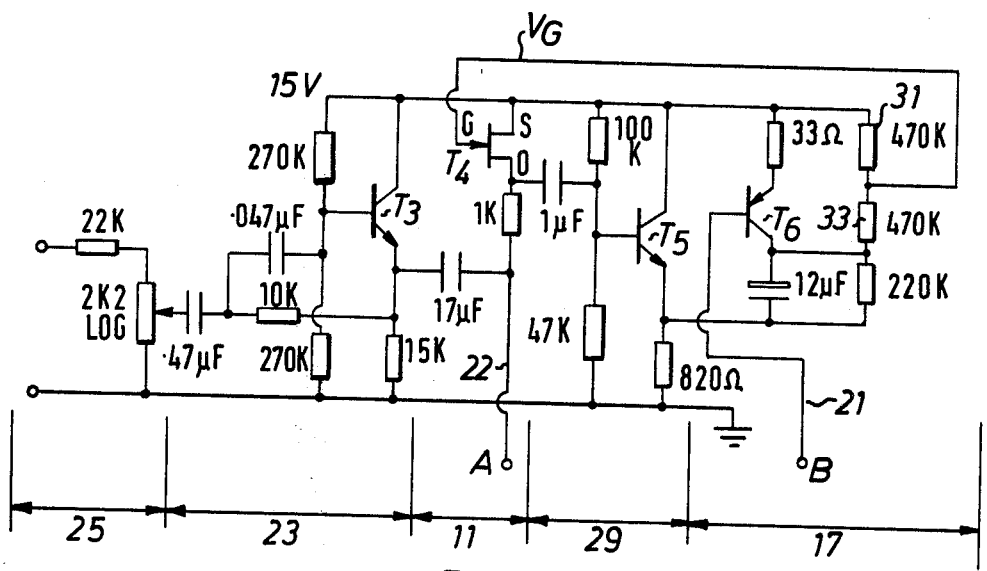
FIG. 9 is a circuit diagram of part of the embodiment of FIG. 8.

To clarify further the control circuitry, that used for blocks 25, 23, 17 and 11 is shown in FIG. 9. The circuit for the controlled filter 11 is similar to that of FIG. 2 but the input impedance of the buffer 29 provides the upper limit of the combined resistance value $R_N$ in the C-R network. The output of this filter is provided at point A which is connected to the feedback circuit 15 and the bass equalization circuit 13. The filter controller 17 is similar to that of FIG. 3 but its negative rail has the drain voltage of transistor $T_4$ imposed upon it. To keep the resistance offered by $T_4$ reasonably linear half the drain voltage is applied to the D.C. level controlling the gate. So the control voltage returned to the gate of $T_4$ is supplied via a potential divider consisting of two 470K resistors 31 and 33. This arrangement allows $w_o$ to decay at a rate of about 1 octave per second at the end of a large input signal.

In a modification (not illustrated) of the embodiment of FIG. 8, implementation of the bass equalizing circuit 13 and feedback circuit 15 is facilitated and stability is improved by modifying the response of the input filter 23 by the factor $(1 + (K/s))^2$, where the constant K, in one example, takes the value of 1300, and modifying the responses of the equalizing circuit 13 and feedback circuit 15 by the inverse of that factor, i.e. $(1 + (K/s))^{-2}$.

It will be appreciated that this modification does not affect the frequency response of the apparatus as a whole, but the signal on line 22 is not in this case directly proportional to output sound pressure from the loudspeaker. The responses of the principal blocks in one example of such a modification are as follows:

Input filter (corresponding to blocks 11, 23, 25 of FIG. 8):
$$\frac{A(1 + \frac{s}{1300})^2}{(1 + \frac{s}{210} + \frac{s^2}{36100})(1 + \frac{\omega o}{s})}$$

Feedback circuit (corresponding to block 15 of FIG. 8):
$$\frac{2}{(1 + \frac{s}{1300})^2}$$

Bass equalizing circuit (corresponding to blocks 13, 27 of FIG. 8):
$$\frac{80(1 + \frac{s}{512} + \frac{s^2}{220000})}{(1 + \frac{s}{1300})^2}$$

where $A$ is equal to or less than 20 depending on the setting of the volume control.

The quantities to which the symbols used above and in the drawings relate are as follows:
- $A$ = Controlled-Filter Gain at High Frequency
- $w_o$ = Controlled Filter Breakpoint Frequency
- $s$ = Natural Frequency
- $G$ = Overall High Frequency Voltage Gain
- $w_r$ = Resonant Frequency of Loudspeaker in Cabinet (Radians/sec)
- $d$ = Damping Factor of Loudspeaker in Cabinet
- $L$ = Travel limit of the Loudspeaker (Meters)
- $k$ = Low Frequency Volts per meter movement of Loudspeaker cone.

I claim:

1. Loudspeaker means in combination with input filtering apparatus therefore, said input filtering apparatus comprising:
   (a) a first high-pass filter connected to receive an input audio signal and having a breakpoint frequency at or near the lower threshold of the audio frequency range;
   (b) a second, variable bandwidth, high-pass filter connected to receive the first high-pass filter output;
   (c) a feedback circuit responsive to the second high-pass filter output to provide a feedback signal as a linear function thereof with a gain which is substantially inversely proportional to the square of the frequency;
   (d) circuit means including threshold means connected with said second high-pass filter and responsive to the said feedback signal to relatively rapidly increase the breakpoint frequency of said second high-pass filter in response to values of the said feedback signal which exceed a threshold and to relatively slowly reduce the said breakpoint frequency in response to values of the said feedback signal which do not exceed the said threshold; and
   (e) bass equalization circuit means connected to receive said second high-pass filter output and having a frequency response at the low end of the audio spectrum which is substantially the inverse of the frequency response of said loudspeaker means, the output of the bass equalization means being connected for supply to said loudspeaker means.

2. Loudspeaker means in combination with input filtering apparatus therefore, said input filtering apparatus comprising:
   (a) first and second filters connected in series to receive an input audio signal, the first filter having a frequency response of $(1 + (K/S))^2 F(s)$ and the second filter being a variable bandwidth, high-pass filter;
   (b) a feedback circuit connected to receive the output from the series connected first and second filters to provide a feedback signal as a function thereof, the said function being of the form $1/(s + k)^2$;
   (c) circuit means including threshold means connected with said second filter and responsive to the said feedback signal to relatively rapidly increase the breakpoint frequency of said second filter in response to values of the said feedback signal which exceed a threshold and to relatively slowly reduce the said breakpoint frequency in response to values of the said feedback signal which do not exceed the said threshold; and
   (d) bass equalization circuit means connected to receive the output of the series connected first and second filters and having a frequency response $$\frac{G(s)}{\left(1 + \frac{K}{s}\right)^2} 2,$$

the output of the bass equalization means being connected for supply to said loudspeaker means; wherein $K$ is a constant, $s$ is the signal frequency, $F(s)$ corresponds generally with the frequency response of a high-pass filter with a breakpoint frequency at or near the lower audio threshold frequency, and $G(s)$ corresponds generally with the inverse of the frequency response of the loudspeaker at the low end of the audio-frequency spectrum.

3. In a loudspeaker system, input filtering apparatus for filtering an input audio signal and supplying the filtered signal to loudspeaker means, the apparatus comprising:
   (i) a variable bandwidth high-pass filter connected to filter the input audio signal and to supply the filtered signal to the loudspeaker means; and
   (ii) control means, connected with said variable bandwidth high-pass filter and selectively responsive to increases and decreases in the amplitude of low audio-frequency components of the audio signal, for respectively increasing and decreasing the breakpoint frequency of said filter so as to limit the amplitude of the low audio-frequency components of the signal supplied to the loudspeaker means.

4. Apparatus as claimed in claim 3 comprising a further high-pass filter connected in series with said variable bandwidth high-pass filter and having a breakpoint frequency near the lower audio threshold frequency.

5. Apparatus as claimed in claim 3 wherein said control means comprises feedback means, responsive to the output of said variable bandwidth high-pass filter, for providing a feedback signal as a substantially linear function thereof with a frequency response characteristic which decreases with increasing frequency, and circuit means, responsive to said feedback signal, for varying the break-point frequency of said filter accordingly.

6. Apparatus as claimed in claim 5 wherein said feedback means comprises a feedback circuit, having a frequency response characteristic which varies substantially inversely with the square of the frequency and connected to receive the output of said variable bandwidth high-pass filter, for providing said feedback signal.

7. Apparatus as claimed in claim 5 wherein said circuit means includes threshold means, connected with said variable bandwidth high-pass filter, for relatively rapidly increasing the said breakpoint frequency thereof in response to values of said feedback signal which exceed a threshold, and for relatively slowly reducing the said breakpoint frequency in response to values of said feedback signal which do not exceed said threshold.

8. Apparatus as claimed in claim 3 further comprising bass equalization circuit means connected to receive the output of said variable bandwidth high-pass filter and having a frequency response at the low end of the audio spectrum which decreases with increasing frequency.

* * * * *